United States Patent

Suzuki et al.

[11] Patent Number: 5,045,381
[45] Date of Patent: Sep. 3, 1991

[54] THERMOSETTING RESIN COMPOSITION, PRINTED CIRCUIT BOARD USING THE RESIN COMPOSITION AND PROCESS FOR PRODUCING PRINTED CIRCUIT BOARD

[75] Inventors: Masao Suzuki, Hitachi; Junichi Katagiri, Ibaraki; Akira Nagai, Hitachi; Masahiro Suzuki, Iwaki; Akio Takahashi, Hitachiota, all of Japan

[73] Assignees: Hitachi, Ltd.; Hitachi Chemical Co., Ltd., both of Tokyo, Japan

[21] Appl. No.: 413,070

[22] Filed: Sep. 27, 1989

[30] Foreign Application Priority Data

Sep. 30, 1988 [JP] Japan ................. 63-246978

[51] Int. Cl.$^5$ ............................. B32B 9/00
[52] U.S. Cl. .................. 428/209; 428/422.8; 428/457; 428/901; 361/397; 361/398; 156/60; 427/96; 264/104
[58] Field of Search ............ 428/209, 422.8, 457, 428/901; 361/397, 398; 156/60; 427/96; 264/104

[56] References Cited

U.S. PATENT DOCUMENTS 4,774,634  9/1988  Tate et al. ................. 29/832

FOREIGN PATENT DOCUMENTS 0364785  4/1990  European Pat. Off.
281152   11/1988  Japan.

Primary Examiner—Patrick J. Ryan
Attorney, Agent, or Firm—Antonelli, Terry, Stout & Kraus

[57] ABSTRACT

A thermosetting resin composition which comprises a cyanate compound or an isocyanate compound represented by the following general formula (I):

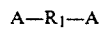

$$A-R_1-A \qquad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

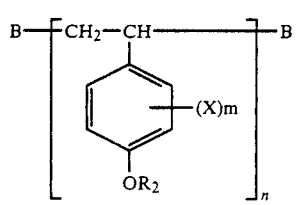

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

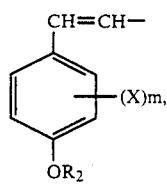

m is an integer of 1 to 4 and n is an integer of 5 to 100, and further containing a compound having at least one N-substituted unsaturated imido group, if required, can produce a printed circuit board of high flame retardness, low dielectric constant, low moisture absorption and a high mechanical strength at an elevated temperature.

8 Claims, 2 Drawing Sheets

THERMOSETTING RESIN COMPOSITION, PRINTED CIRCUIT BOARD USING THE RESIN COMPOSITION AND PROCESS FOR PRODUCING PRINTED CIRCUIT BOARD

BACKGROUND OF THE INVENTION

This invention relates to a thermosetting resin composition and its uses, and particularly to a thermosetting resin composition for a printed circuit board having a good flame retardness and a printed circuit board using the resin composition.

Heretofore, phenol resin, epoxy resin, polyimide resin, etc. have been used as resin materials for multi-layered printed circuit boards to be used in electronic computers, etc. Recent large-scale electronic computers require a high speed computation and thus strict characteristics are required for the multi-layered printed circuit boards for this purpose and development of new materials for the multi-layered printed circuit boards is now in progress.

Generally, the computing speed of an electronic computer largely depends on the signal transmission speed of the circuit on a multi-layered printed circuit board used in the electronic computer. The signal transmission speed of the circuit also depends on the dielectric constant of the insulating layer. The lower the dielectric constant, the higher the signal transmission speed. Thus, the computing speed of an electronic computer can be improved by making a printed circuit board from materials of low dielectric constant.

Polytetrafluoroethylene (PTFE), polybutadiene, etc. are known as materials of low dielectric constant. Furthermore, cyanate compounds (U.S. Pat. No. 4,559,3999) or isocyanate compounds (U.S. Pat. No. 4,353,7691) having a structure of low polarization based on a aromatic group or alicylic group or a combination thereof on the main chain are also known as materials of low dielectric constant.

PTFE belongs to a thermoplastic resin and has problems such as poor dimensional stability and throughhole reliability, when used in multi-layered printed circuit boards. Still furthermore, no appropriate solvent is available for PTFE and thus the lamination bonding has been relied only on a heat fusion pressing.

Owing to a high melting temperature such as 250° C. to 350° C., PTFE has a poor workability and problems in the handling, as compared with the conventional epoxy resin, etc.

As to the polybutadiene, on the other hand, resin materials based on a combination of 1,2-polybutadiene having double bonds on the side chains with a cross-linking type flame retardant based on bifunctional monomers have been developed [Japanese Patent Application Kokai (Laid-open) No. 55-126451]. When a lower molecular weight polymer is used in view of the impregnation property toward fibrous substrate materials, the tackiness of the resulting prepreg is so high that it is difficult to cut or preserve the prepreg and also an adverse effect is given on the lamination-bonding workability. When a higher molecular weight polymer is used in view of a low tackiness or tackfreeness of a prepreg, the impregnation property toward fibrous substrate materials is deteriorated due to the higher varnish viscosity and it is not easy to prepare a prepreg. That is, the resulting printed circuit boards have no satisfactory qualities. Furthermore, the curing reaction is a cross-linking reaction based on radical polymerization and thus the reaction rate is so high that its control is not easy. Still furthermore, polybutadiene is liable to form cracks, when molded, because of a high curing shrinkage and has low mechanical strength and heat resistance and a low adhesion to copper foils that form circuits.

The cyanate compounds or isocyanate compounds are trimerized in the presence of a catalyst to form cured products of high cross-linking density. The cured products have a low dielectric constant and good dimensional stability and heat resistance, but has no satisfactory flame retardness as an important characteristic of printed circuit boards.

In order to improve the foregoing disadvantages, Japanese Patent Application Kokai (Laid-open) No. 61-243844 (=U.S. patent application Ser. No. 86/854507; EP Patent Application No. 86105550.7) proposes a thermosetting resin composition comprising a prepolymer of poly(p-hydroxystyrene) derivative and 1,2-polybutadiene or its derivative, a laminated board using the resin composition, and a process for producing the laminated board, and Japanese Patent Application Kokai (Laid-open) No. 62-192406 (=U.S. patent application Ser. No. 87/15325; EP Patent application No. 87102069.9) proposes a flame-retarding resin composition comprising a prepolymer of poly(p-hydroxystyrene) derivative as an essential component, and a prepreg and a laminated board using the resin composition, but the laminated boards made from these resin compositions still have problems in the moisture absorption, chronological change and mechanical characteristics at an elevated temperature.

SUMMARY OF THE INVENTION

An object of the present invention is to provide a flame-retardant, thermosetting resin composition, a printed circuit board using the resin composition and a process for producing the printed circuit board, free from the foregoing disadvantages of the prior art.

According to the first aspect of the present invention, there is provided a thermosetting resin composition which comprises a cyanate compound or an isocyanate compound represented by the following general formula (I):

$$A-R_1A \quad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

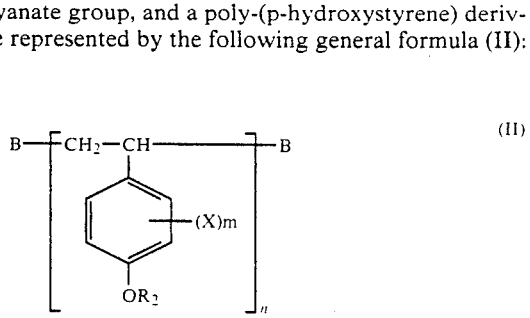

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

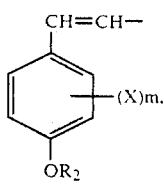

m is an integer of 1 to 4 and n is an integer of 5 to 100.

According to the second aspect of the present invention there is provided a thermosetting resin composition which comprises a cyanate compound or an isocyanate compound represented by the following general formula (I):

$$A—R_1—A \qquad (I)$$

wherein $R_1$ is an aromatic group, an alicylic group or a mixed group thereof and A is a cyanate group or an isocyanate group, and a poly-(p-hydroxystyrene) derivative represented by the following general formula (II):

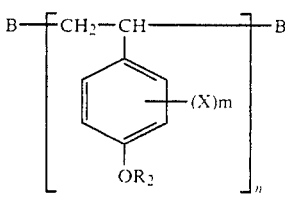

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

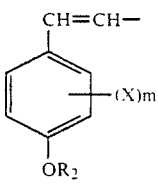

m is an integer of 1 to 4 and n is an integer of 5 to 100, and a compound having at least one N-substituted unsaturated imido group.

According to the third aspect of the present invention there is provided a thermosetting resin composition wherein a mixing ratio of the cyanate compound or isocyanate compound represented by the general formula (I) to the poly (p-hydroxystyrene) derivative represented by the general formula (II) is in a range of 20:80 to 80:20 by weight in the first and second aspect of the present invention.

According to the fourth aspect of the present invention there is provided a curable material which comprises a woven fabric or non-woven fabric of inorganic fibers or organic fibers, impregnated with a thermosetting resin composition which comprises a cyanate compound or an isocyanate compound represented by the following general formula (I):

$$A—R_1—A \qquad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

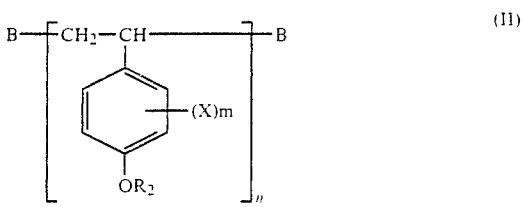

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

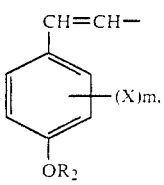

m is an integer of 1 to 4 and n is an integer of 5 to 100, or a thermosetting resin composition which comprises a cyanate compound or an isocyanate compound represented by the following general formula (I):

$$A—R_1—A \qquad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

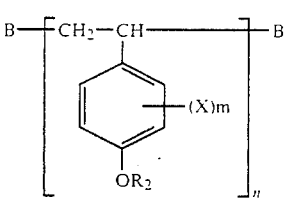

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

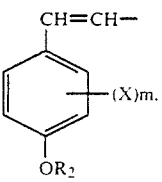

m is an integer of 1 to 4 and n is an integer of 5 to 100, and a compound having at least one N-substituted unsaturated imido group.

According to the fifth aspect of the present invention, there is provided a printed circuit board, which comprises a conductor of a metallic foil and an insulating layer made of a fibrous substrate material impregnated and cured with a thermosetting resin composition, the thermosetting resin composition comprising a cyanate compound or an isocyanate compound represented by the following general formula (I):

$$A-R_1-A \qquad (I)$$

wherein $R_1$ is an aromatic group, an alicylic group or a mixed group thereof and A is a cyanate group or an isocyanate group, and a poly-(p-hydroxystyrene) derivative represented by the following general formula (II):

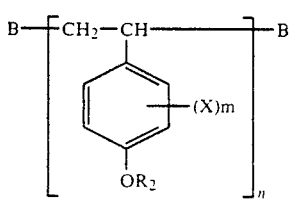

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

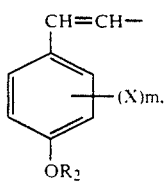

m is an integer of 1 to 4 and n is an integer of 5 to 100.

According to the sixth aspect of the present invention there is provided a printed circuit board, which comprises a conductor of a metallic foil and an insulating layer made of a fibrous substrate material impregnated and cured with a thermosetting resin composition, the thermosetting resin composition comprising a cyanate compound or an isocyanate compound represented by the following general formula (I):

$$-R_1-A \qquad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

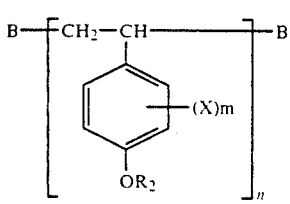

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

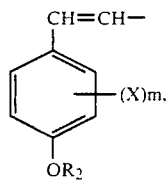

m is an integer of 1 to 4 and n is an integer of 5 to 100, and a compound having at least one N-substituted unsaturated imido group.

According to the seventh aspect of the present invention, there is provided a multi-layered, printed circuit board, which comprises a lamination of a plurality of printed circuit boards each comprising a conductor of a metallic foil and an insulating layer made of a fibrous substrate material impregnated and cured with a thermosetting resin composition, the thermosetting resin composition comprising a cyanate compound or an isocyanate compound represented by the following general formula (I):

$$A-R_1-A \qquad (I)$$

wherein $R_1$ is an aromatic group, an alicylic group or a mixed group thereof and A is a cyanate group or an isocyanate group, and a poly-(p-hydroxystyrene) derivative represented by the following general formula (II):

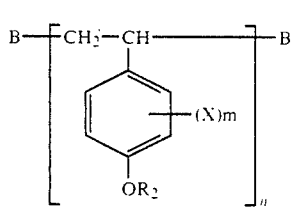

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

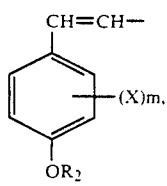

m is an integer of 1 to 4 and n is an integer of 5 to 100, or printed circuit boards each comprising a conductor of a metallic foil and an insulating layer made of a fibrous substrate material impregnated and cured with a thermosetting resin composition, the thermosetting resin composition comprising a cyanate compound or an isocyanate compound represented by the following general formula (I):

$$A-R_1-A \qquad (I)$$

wherein $R_1$ is an aromatic group, an alicylic group or a mixed group thereof and A is a cyanate group or an isocyanate group, and a poly-(p-hydroxystyrene) derivative represented by the following general formula

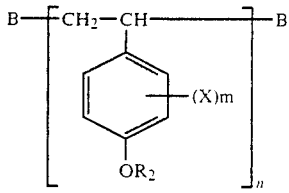
(II)

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

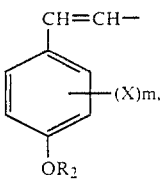

m is an integer of 1 to 4 and n is an integer of 5 to 100, and a compound having at least one N-substituted unsaturated imido group.

According to the eighth aspect of the present invention there is provided a process for producing a printed circuit board, which comprises:

a step of heating a thermosetting resin composition which comprises a cyanate compound or an isocyanate compound represented by the following general formula (I):

 (I)

wherein $R_1$ is an aromatic group, an alicyclic group or a mixed group thereof and A is a cyanate group or an isocyanate group, and a poly-(p-hydroxystyrene) derivative represented by the following general formula (II):

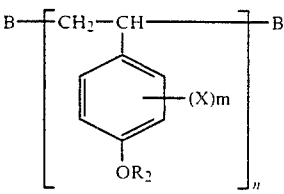
(II)

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

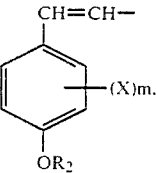

m is an integer of 1 to 4 and n is an integer of 5 to 100, thereby forming a prepolymer;

a step of dissolving the prepolymer in a solvent, thereby forming an impregnation varnish, impregnating a fibrous substrate material with the impregnation varnish, followed by drying, thereby preparing a prepreg; and a step of laminating a plurality of the thus obtained prepregs, thereby obtaining a laminate, and pressing the laminate together with conductor metal foils with heating.

According to the ninth aspect of the present invention there is provided a process for producing a printed circuit board, which comprises:

a step of heating a thermosetting resin composition which comprises a cyanate compound or an isocyanate compound represented by the following general formula (I):

 (I)

wherein $R_1$ is an aromatic group, an alicylic group or a mixed group thereof and A is a cyanate group or an isocyanate group, and a poly-(p-hydroxystyrene) derivative represented by the following general formula (II):

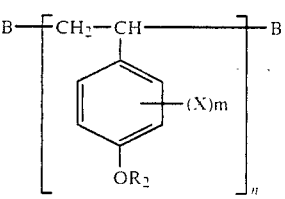
(II)

wherein X is a fluorine atom, a bromine atom and a chlorine atom, $R_2$ is an alkenyl group and an unsaturated carboxyl group, each having 2 to 4 carbon atoms, B is any one of a polymerization initiator residue, a polymerization-terminating agent residue, H and

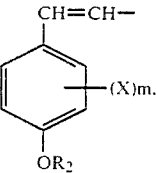

m is an integer of 1 to 4 and n is an integer of 5 to 100 and a compound having at least one N-substituted unsaturated imido group, thereby forming a prepolymer;

a step of dissolving the prepolymer in a solvent, thereby forming an impregnation varnish, impregnating a fibrous substrate material with the impregnation varnish, followed by drying, thereby preparing a prepreg; and a step of laminating a plurality of the thus obtained prepregs, thereby obtaining a laminate, and pressing the laminate together with conductor metal foils with heating.

The present inventors have found that a resin composition having a good flame retardness, a low moisture absorption and a high mechanical strength at an elevated temperature can be obtained without impairing the dielectric constant by combining at least one of cyanate compounds and isocyanate compounds represented by the foregoing general formula (I) with a crosslinking type, flame retardant represented general formula (II) and have established the present invention.

In the present invention, the aromatic group and the alicyclic group represent by $R_1$ in the general formula (I) include:

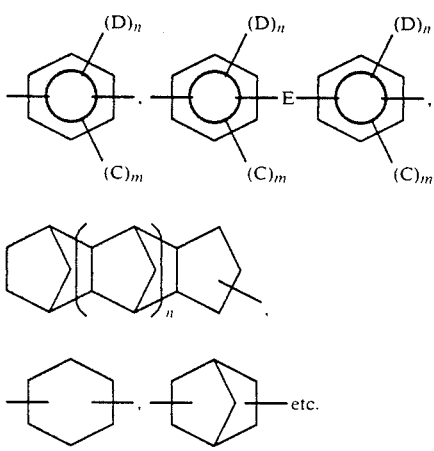

wherein C is —H, —CH$_3$, —CH$_2$CH$_3$; D is —OCN and —NCO; E is —, —CH$_2$—, —O—, —S—,

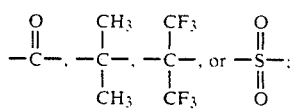

m is an integer of 1 to 4 and n is O and an integer of 1 to 3, and the mixed group thereof is a group having at least a few of the foregoing aromatic and alicyclic groups in the skeleton structure and can have a plurality of the same aromatic or alicyclic groups as linked in succession in the skeleton structure.

Specific examples of the compounds represented by the general formula (I) include 2,2-bis(4,4'-dicyanatophenyl)propane, 2,2-bis(4,4'-diisocyanatophenyl)propane, tetramethylxylenedicyanate, tetramethylxylenediisocyanate, diphenylmethane dicyanate, diphenylmethanediisocyanate, cyanates and isocyanates whose $R_1$ is 4,4'-dihydroxydiphenyloxide, resorcinol, 4,4'-thioiphenol, 3,3',5,5'-tetrabromobisphenol-A, 2,2',6,6'-tetrabromobisphenol-A, 3-phenylbisphenol-A, 4,4'-dihydroxybiphenyl, 2,2'-dihydroxybiphenyl, 2,2',4,4'-tetrahydroxybiphenylmethane, 2,2',6,6'-tetramethyl3,3',5,5'-tetrabromobisphenol-A, 5,5'-dimethoxybisphenol-A, bisphenol of dicyclopentadiene, or bisphenol of tricyclopentadiene, polycyanates and polyisocyanates of phenol-formaldehyde condensates, polycyanates and polyisocyanates of phenoldicyclopentadiene condensates, polycyanates and polyisocyanates of 2,2',4,4'-tetrahydroxy diphenylmethane, etc. and can be used alone or in combination of at least two thereof.

Specific examples of the compound represented by the general formula (II) include poly(p-vinylbromophenylallylether), poly (p-vinyl-bromophenylisopenylether), poly(p-vinylbromophenyl-1,1'-dimethylbutenylether), poly(p-vinylbromophenylmethacrylate), poly(p-inylbromophenylallylether), etc, where n of the compound (II) can be an integer of 5 to 100, and depends on the species and molecular weight of the compound (I) to be used together and also on a mixing ratio of the compound (I) to the compound (II). When n exceeds 100, the viscosity of the resin composition will be higher and the impregnation toward the substrate material will be deteriorated, resulting in occurrence of voids at the lamination-bonding. When n is below 5, on the other hand, the preservation stability of the resin composition will be deteriorated and the flowability of the resin composition will be higher, resulting in the resin loss at the lamination-bonding.

The mixing ratio of the compound (I) to the compound (II) in the resin composition is in a range of 20:80 to 80:20 by weight. When the compound (I) is contained in a mixing ratio of more than 80, no satisfactory flame retardness can be obtained, whereas the mixing ratio of the compound (II) is more than 80, the feature of materials of low dielectric constant cannot be fully obtained.

A compound having at least one of N-substituted, unsaturated imido groups can be added to the resin composition comprising the compound (I) and the compound (II) as a cross-linking promoter, and includes, for example, bismaleimides such as N-substituted phenylmaleimide, phenylcitraconimide, phenylitaconimide, phenylnadic imide (phenylmethylendomethylenetetrahydrophthalimide), N,N'-p-phenylenebismaleimide, N,N'-p-phenylenebismethylendomethylenetetraphthalimide, N,N'-p-phenylenebiscitraconimide, N,N'-p-phenylenebis-itaconimide, N,N'-m-xylenebismaleimide, N,N'-m-phenylenebismaleimide, N,N'-p-phenylenebismaleimide, N,N'-(methylene-di-p-phenylene)bismaleimide, N,N'-4,4'-diphenylthioetherbismaleimide, N,N'-4,4'-diphenyletherbismaleimide, N,N'-methylenebis(3-chloro-p-phenylene)bismaleimide, N,N'-(sulfonyl-di-p-phenylene)bismaleimide, N,N'-4,4'-diphenylcyclohexanebismaleimide, 2,2-bis[4-(4-maleimidophenoxy)-phenyl]propane, 2,2-bis[4-(4-maleimidophenoxy)-phenyl]-1,1,1,3,3,3-hexafluoropropane, 2,2-bis[4-(4-maleimido-2-trifluoromethylphenoxy)-phenyl]1,1,1,3,3,3-hexafluoropropane, etc., and multivalent maleimides obtained by reaction of a condensate of aniline and aldehyde with maleic anhydride and represented by the following general formula (III), etc:

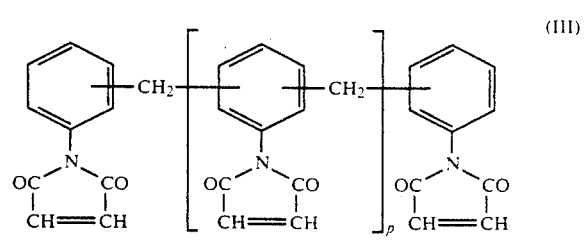

where p is an integer of 1 to 10.

The present process for producing a laminated board will be described below.

A resin composition composed of the compound (I) and the compound (II) is dissolved in an organic solvent in a mixing ratio in the aforementioned range to prepare a varnish having a resin content of 20 to 80% by weight. To promote the dissolution, heating can be conducted. As the organic solvent, toluene, xylene, methylethylketone, methylisobutylketone, methanol, ethanol, 3-methoxypropanol, N,N-dimethylformamide, N-methylpyrrolidone, dimethylsulfoxide, trichloroethylene, etc., or those which can uniformly dissolve the compounds (I) and (II) can be used alone or in combination.

A trimerization catalyst for the cyanate group or the isocyanate group and a radical polymerization initiator is then added to the thus prepared varnish to make an impregnation varnish. As the trimerization catalyst, metal salts such as cobalt naphthenate, cobalt octenoate, zinc octenoate, potassium acetate, sodium acetate, sodium cyanide, sodium cyanate, sodium isocyanate, sodium boride, etc.; sodium methoxide; sodium hydroxide; organic base such as pyridin; tertiary amines such as triethylamine, etc.; Lewis acids such as aluminum chloride, bromine trifluoride, ferric chloride, titanium chloride, zinc chloride, etc. can be used. As the radical polymerization initiator, benzoyl peroxide, dicumyl peroxide, methylethylketone peroxide, t-butyl peroxylaurate, di-t-butyl peroxyphthalate, dibenzyl peroxide, 2,5-dimethyl-2,5-di(t-butylperoxy)hexine-3, etc. can be used. 0.1 to 10 parts by weight of these trimerization catalyst and radical polymerization initiator is used per 100 parts by weight of the resin composition.

Then, a fibrous substrate material is impregnated and coated with the thus prepared impregnation varnish and dried at room temperature to 170° C. to obtain a prepreg free from the tackiness. The drying temperature depends on the species of the solvent and radical polymerization initiator used.

Then, a desired number of the thus obtained prepregs is laid upon one another and cured with heating at 120° C. to 250° C. under a pressure of 1 to 100 kg f/cm² to obtain a laminated board.

As the fibrous substrate material, those usually used as laminated board materials can be used in the present invention. Woven fabrics or non-woven fabrics of inorganic fibrous substrate materials such as glass fibers, for example, E glass fibers, C glass fibers, A glass fibers, S glass fibers, D glass fibers, YM-31-A glass fibers containing $SiO_2$, $Al_2O_3$, etc. as main components, and A glass fibers made of quartz, etc. or woven fabrics or non-woven fabrics of organic fibers such as aramid fibers containing polymer compounds having as aromatic polyamide-imide skeleton can be used in the present invention.

In the present invention, an inorganic filler such as silica powder, etc. or an organic filler such as perfluoroethylene powder, polyimide powder, polyamide powder, etc. can be added to the resin composition, and it is particularly important in attaining the effect of the present invention to use a filler having a dielectric constant of not more than 3.3.

That the present thermosetting resin composition can produce a laminated board of low dielectric constant and a good flame retardness is not only due to the fact that the cyanate compound or the isocyanate compound (I) itself has a low dielectric constant, but also due to the fact that the cross-linking type, polymeric flame retardant (II) is a material of unexpectedly low dielectric constant and further that the flame retardness and electric characteristics are not deteriorated even by copolymerization of the crosslinking type, polymeric flame retardant (II) with the cyanate or isocyanate compound (I).

The present invention will be described in detail below, referring to Examples and the accompanying drawings.

BRIEF DESCRIPTION OF THE DRAWINGS

In FIGS. 1 to 3, numerals 1 is a varnish prepared from the present resin composition; 1' is uncured resin; 2 a glass cloth; 3 a prepreg; 4 a copper foil; 5 a hot plate; 6 a copper-laminated board; 7 a cured resin; 8,8' and 8" inner layer circuit boards; 9 a multi-layered, printed circuit board; 10 an inner layer printed circuit; 11 an outer layer printed circuit; and 12 a through hole.

PREFERRED EMBODIMENTS OF THE INVENTION

Example 1

Figure 1:
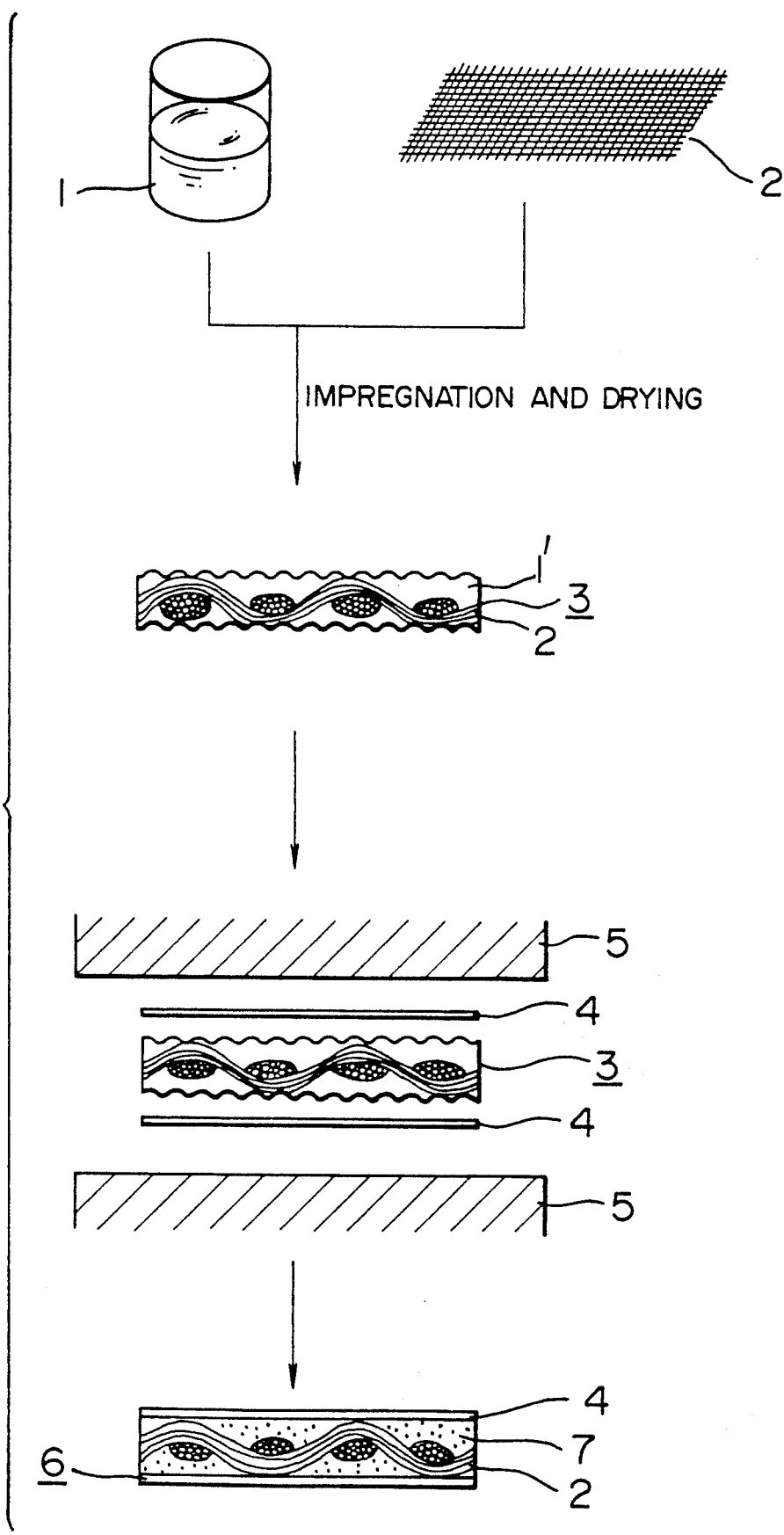
FIG. 1 shows process steps for preparing a board laminated with copper foils at both outer sides, as viewed in cross-section.

XU-71787 (trademark of a cyanate compound prepared by Dow Chemical Company, U.S.A) represented by the general formula (I) and poly-(p-vinylbromophenylmethacrylate represented by the general formula (II) [average molecular weight: 6,600; m is about 2 and n is about 20 in the general formula (II)] as a flame retardant were mixed in a mixing ratio of 1:1 by weight and the resulting resin composition was dissolved in N,N-dimethylformamide as a solvent with heating at 60° C. for 30 minutes to prepare a varnish having a solid content of 50% by weight. After cooling, 0.5 parts by weight of 2,5-di(t-butylperoxy) hexine-3(made by Nihon Yushi K.K., Japan) as a radical polymerization initiator and 0.5 parts by weight of cobalt naphthenate as a trimerization catalyst for the cyanate compound were added to the varnish on the basis of 100 parts by weight of the resin composition to prepare an impregnation varnish.

Glass cloth (250 mm square; thickness: 0.05 mm; E glass made by Nitto Boseki K.K., Japan) was impregnated and coated with the thus prepared varnish and dried in air at 150° C. for 10 minutes to prepare a prepreg. 250 mm square, (resin content: 40-70% by weight).

Then, 20 sheets of the thus prepared prepregs were laid one upon another and pressed between a pair of hot plats under a pressure of 30 kg f/cm² at first at 130° C. for 40 minuts, then at 170° C. for one hour, and lastly at 200° C. for one hour with heating to cure the resin to obtain a laminated board.

Separately, the impregnation varnish was applied to a polyethylene terephthalate sheet and dried at 150° C. for 10 minutes to obtain a powdery resin composition. The thus obtained resin composition was press-molded into a plate form, 15 cm × 10 cm² mm thick, and cured under the same conditions as used for the preparation of the prepreg as above, to form a resin

Example 2

A laminated board and a resin plate were prepared in the same manner as in Example 1, except that 2,2-bis(4,4'-dicyanatophenyl)propane was used as a cyanate compound in place of XU-71787.

Example 3

A laminated board and a resin plate were prepared in the same manner as in Example 1, except that ditrifluoro-bis(4,4'-dicyanatophenyl)methane was used as a cyanate compound in place of XU-71787.

Example 4

A laminated board and a resin plate were prepared in the same manner as in Example 1, except that 2,2-bis(4,4'-dicyanatophenyl)propane was used as a cyanate compound in place of XU-71787, and poly-(p-vinylbromophenylacrylate) was used as a flame retandant in place of poly-(p-vinylbromophenylmethacrylate).

Example 5

A laminated board and a resin plate were prepared in the same manner as in Example 1, except that a mixture of 2,2-bis(4,4'-dicyanatophenyl)propane as a cyanate compound, poly-(p-vinylbromophenylmethacrylate) as a flame retardant [average molecular weight: 6,600; m is about 2 and n is about 20 in the general formula (II)] and 2,2-[4-(4-maleimidophenoxy)phenyl]propane as an aromatic bismaleimide in a ratio of 4:4:2 by weight was dissolved in N,N-dimethylformamide to prepare a varnish.

Example 6

A laminated board and a resin plate were prepared in the same manner as in Example 1, except that 2,2-bis(4,4'-diisocyanatophenyl)propane was used as an isocyanate compound in place of the cyanate compound.

Example 7

A laminated board and a resin plate were prepared in the same manner as in Example 1, except that poly(p-vinylbromophenylacrylate [average molecular weight: 3,300; m is 2 and n is 10 in the general formula (II)] was used as a flame retardant.

Example 8

A laminated board and a resin plate were prepared in the same manner as in Example 1, except that poly-(p-vinylbromophenylallylether) [average molecuar weight: 8,800; m is about 2 and n is about 30 in the general formula (II)] was used as a flame retardant.

Example 9

A laminated board and a resin plate were prepared in the same manner as in Example 1, except that 2,2-bis(4,4'-diisocyanatophenyl)propane was used as an isocyanate compound in place of XU-71787 and poly(p-vinylbromophenylacrylate) [average molecular weight: 6,600; m is about 2 and n is about 20 in the general formula (II)] was used as a flame retardant.

Example 10

A laminated board and a resin plate were prepared in the same manner as in Example 1, except that dicyclopentanedicyanate was used as a cyanate compound in place of XU-71787.

Example 11

A laminated board and a resin plate were prepared in the same manner as in Example 1, except that trichloropentanediisocyanate was used as an isocyanate compound in place of XU-71787.

Example 12

A laminated board and a resin plate were prepared in the same manner as in Example 1, except that a mixture composed of XU-71787 as a cyanate compound and poly(p-vinylbromophenylmethacrylate) [average molecular weight: 27,000; m is 4 and n is 90 in the general formula (II)] as a flame retardant in a mixing ratio of 7:3 by weight was used.

Comparative Example 1

A laminated board and a resin plate were prepared in the same manner as in Example 1, except that a mixture of 100 parts by weight of XU-71787 as cyanate compound and one part by weight of cobalt naphthenate was dissolved in N,N-dimethylformamide as a solvent to prepare an impregnation varnish.

Comparative Example 2

A laminated board and a resin plate were prepared in the same manner as in Example 1, except that a polyimide material MCL-167 (trademark of a product made by Hitachi Kasei Kogyo K.K., Japan) was used in place of the resin composition.

Comparative Example 3

Epoxy-modified polybutadiene EP-50 (trademark of a product made by Nihon Soda K.K., Japan) and flame-retardant poly(p-vinylbromophenylmethacrylate) [average molecular weight: 6,600; m is about 2 and n is about 20 in the general formula (II)] were mixed together in a mixing ratio of 20:80 by weight and dissolved in N,N'-dimethylformamide with heating at 60° C. for 30 minutes to prepare a varnish having a solid content of 50% by weight.

Then, 2 parts by weight of 2,5-di(t-butylperoxy) hexine-3(product made by Nihon Yushi K.K., Japan) and 2 parts by weight of dicyandiamide (product made by Wako Junyaku K.K., Japan) as an epoxy curing agent were added to the thus obtained varnish on the basis of 100 parts by weight of the solid component of the varnish to prepare an impregnation varnish. With the thus prepared varnish, a laminated board and a resin plate were prepared in the same manner as in Example 1

Comparative Example 4

XU-71787 as a cyanate compound and a brominated epoxy resin Araldite 8011 (product made by Ciba-Geigy Co., Switzerland) were mixed in a mixing ratio of 50:50 by weight and dissolved in methylisobutylketone to prepare a varnish having a solid content of 50% by weight. One part by weight of each of cobalt naphthenate and dicyandiamide were added to the thus prepared varnish on the basis of 100 parts by weight of the solid content of the varnish to prepare an impregnation varnish. With the thus prepared impregnation varnish, a laminated board and a resin plate were prepared in the same manner as in Example 1.

Characteristics of the laminated boards and the resin plates prepared in the foregoing Examples 1 to 12 and Comparative Examples 1 to 4 are shown in Tables 1 and 2, respectively.

The characteristics of the laminated boards and the resin plates were determined according to the following procedures:

Dielectric constant of a laminated board and a resin plate was measured by an LP impedance analyzer 4192A (made by Hewlett Packard Co.) according to JIS-C6481.

Bending strength of a resin plate was measured by an an autograph DDS-500 (made by Shimadzu Seisakusho K.K., Japan) by subjecting a sample, 50 mm wide×2 mm thick × 45 mm long, to testing conditions of a span of 30 mm between two points of support at a deflection rate of 2 mm/min at room temperature and 180° C.

Thermal decomposition-initiation temperature of a resin plate was measured by a high speed, differential thermal balance TGD-7000RH (made by Nihon Shinku Riko K.K., Japan) by subjecting 10 mg of powdery sample to heating at a rate of 10° C./min. in pure air to measure the weight loss due to the heating and determine the thermal decomposition-initiation temperature from the thus obtained weight loss-initiation temperature.

Moisture absorption of a resin plate was measured by subjecting the plate to moisture absorption in an atmosphere at 65° C. and 95% relative humidity to obtain its saturation amount of moisture absorption according to JIS-C-6481.

Coefficient of thermal expansion of a laminated board was measured by a thermophysical tester TMA-1500 (made by Nihon Shinku Riko K.K., Japan) by cutting out a laminated board sample, 6 mm × 6 mm, and subjecting it to heating at a rate of 2° C./min. and determining the coefficient from the thus obtained thermal expansion curve in a range of 50° C. to 220° C.

Flame retardness of a laminated plate was evaluated by a vertical method according to UL-94 Code.

Peeling strength was measured according to JIS-C-6481 by cutting out a sample of specific size from a copper foil-laminated board.

pared in the same manner as in Example 1 and pressed between hot plates 5 of a press with heating under the same conditions as in Example 1 to cure uncured resin 1' to cured resin 7 to obtain a board 6 laminated with the copper foils 4 at both sides.

Figure 2:
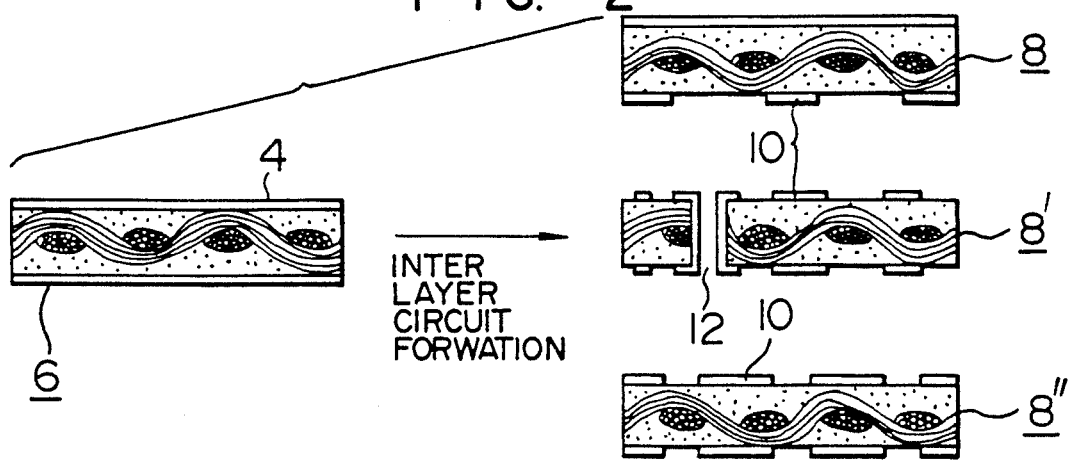
FIG. 2 shows a process step for preparing an inner layer circuit board as viewed in cross-section.
Figure 3:
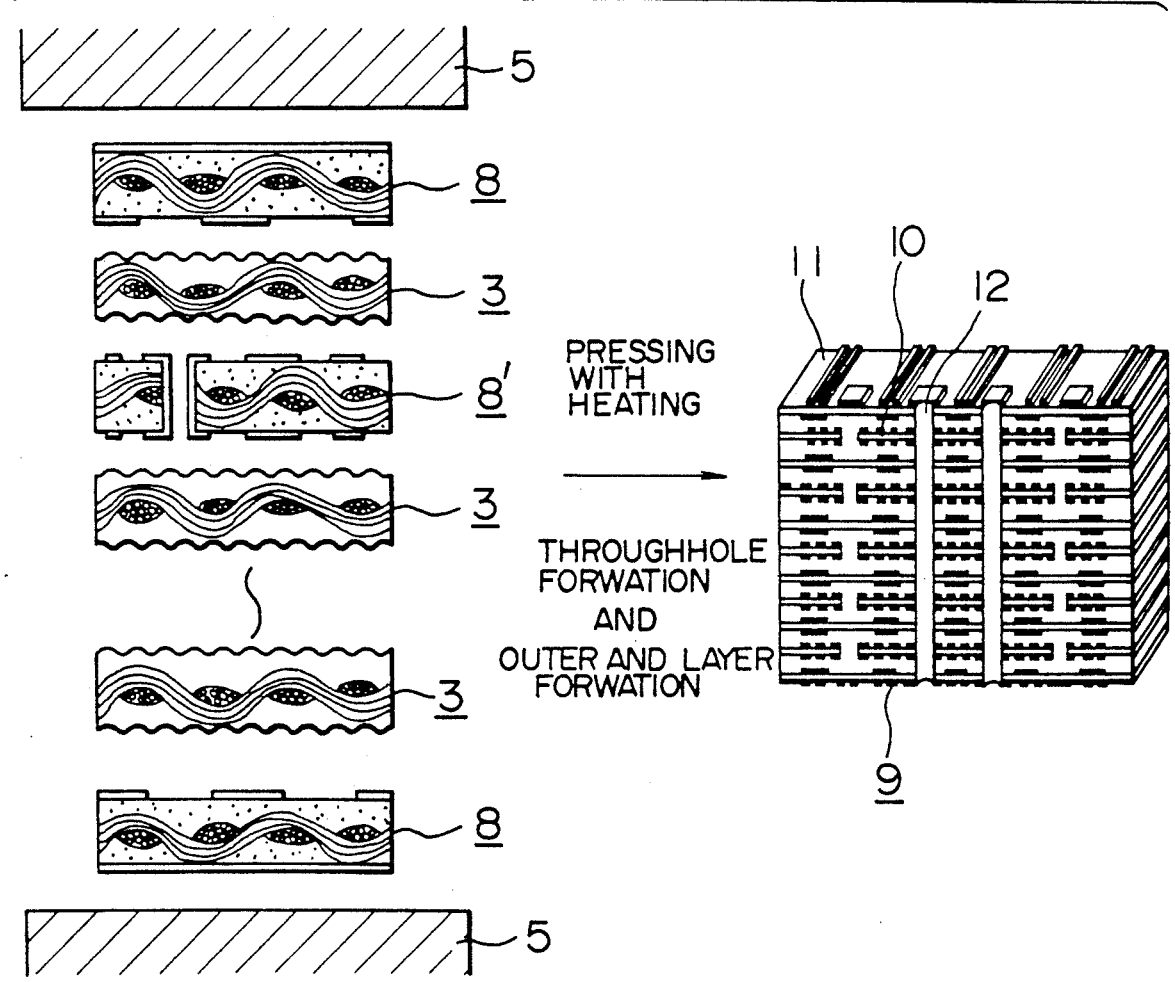
FIG. 3 shows a process step for preparing a multi-layered printed circuit board.

Then, the thus obtained boards 6 laminated with the copper foils 4 were subjected to resist baking, etching, drilling, etc. to form an inner layer circuit 10, as shown in FIG. 2.

Then, 11 sheets in total of an appropriate combination of the thus prepared laminated boards 8, 8' and 8'' with the circuit 10 were placed one upon another with the prepregs 3 placed therebetween and pressed between the hot plates 5 of a press with heating under the same conditions as above to form a laminated, circuit board. Then, outer layer circuits 11 and throughholes 12 were formed on the thus obtained laminated circuit board to obtain a laminated, printed circuit board 9, as shown in FIG. 9.

Cyanate compounds and isocyanate compounds having an aromatic ring in the main skeleton have a low dielectric constant and a low moisture absorption and thus can be used unexpectedly a materials for multi-layered circuit boards for electronic apparatuses such as large-scale electronic computers, etc., but require inclusion of a flame-retardant to give a satisfactory flame retardness to the materials. In the prior art, a considerable decrease in the main characteristics such as the dielectric constant, moisture absorption, heat resistance,

TABLE 1

| | Example | | | | | | | | | | | | Comparative Example | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 1 | 2 | 3 | 4 |
| Dielectric constant (1 MHz) | 3.2 | 3.3 | 3.2 | 3.3 | 3.4 | 3.2 | 3.3 | 3.2 | 3.3 | 3.3 | 3.3 | 3.4 | 3.2 | 4.7 | 3.7 | 4.3 |
| Coefficient of thermal expansion ($\times 10^{-5}$/°C.) | 7 | 8 | 8 | 8 | 7 | 9 | 8 | 7 | 7 | 9 | 7 | 9 | 7 | 8 | 12 | 15 |
| Flame retardness (UL-94) | V0 | V0 | V0 | V0 | V0 | V0 | V0 | V0 | V0 | V0 | V0 | V0 | V2 | V0 | V0 | V0 |
| Peeling strength (kgf/cm²) | 1.2 | 1.0 | 1.2 | 1.1 | 1.3 | 1.1 | 1.1 | 1.0 | 1.2 | 1.1 | 1.3 | 1.3 | 1.5 | 1.4 | 1.0 | 1.5 |

TABLE 2

| | | Example | | | | | | | | | | | | Comparative Example | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 | 3 | 4 |
| Dielectric constant (1 MHz) | | 3.1 | 3.2 | 3.1 | 3.2 | 3.2 | 3.1 | 3.2 | 3.3 | 3.1 | 3.2 | 3.2 | 3.3 | 3.1 | 3.8 | 3.5 | 4.0 |
| Bending strength (kgf/mm²) | Room temp. | 13.2 | 13.5 | 14.0 | 12.5 | 13.0 | 13.0 | 12.0 | 12.5 | 13.0 | 12.5 | 13.5 | 12.0 | 7.0 | 11.6 | 12.0 | 11.0 |
| | 180° C. | 8.3 | 8.1 | 8.3 | 8.4 | 9.2 | 8.2 | 8.3 | 7.0 | 7.5 | 8.4 | 8.3 | 5.0 | 13.5 | 3.4 | 6.3 | 5.5 |
| Thermal decomposition initiation temp. (°C.) | | 340 | 330 | 340 | 330 | 330 | 340 | 330 | 340 | 340 | 330 | 330 | 345 | 340 | 340 | 310 | 250 |
| Moisture absorption (%) | | 1.0 | 1.0 | 1.0 | 1.0 | 1.3 | 1.1 | 1.0 | 1.0 | 1.1 | 1.0 | 1.0 | 1.0 | 1.0 | 1.8 | 1.1 | 4.0 |

Example 13

As shown in FIG. 1, copper foils 4 (TST0 copper foil, made by Furukawa Circuit K.K., Japan) were placed on both sides of an prepreg 3, 250 mm square, prepared from an impregnation varnish 1 and glass cloth 2 preetc. is not avoidable.

The present resin composition comprising the cyanate compound or isocyanate compound and a poly(-phydroxystyrene) derivative can satisfy the foregoing characteristics and a high flame retardness at the same time. The cured moldings made from the present composition also have a high mechanical strength at an elevated temperature and a low coefficient of thermal expansion. The present invention can provide multi-layered, printed circuit boards of high density, free from crack occurrence at the preparation of multi-layered, printed circuit boards, and having an improved dimensional stability and a high reliability. When the present multi-layered, printed circuit boards are used in large-scale electronic computers, an increase in the computing speed ca be expected.

What is claimed is:

1. A printed circuit board, which comprises a conductor of a metallic foil and an insulating layer made of a fibrous substrate material impregnated and cured with a thermosetting resin composition, the thermosetting resin composition comprising a cyanate compound or an isocyanate compound represented by the following general formula (I):

    (I)

wherein $R_1$ is an aromatic group, an alicyclic group or a mixed group thereof and A is a cyanate group or an isocyanate group, and a poly-(p-hydroxystyrene) derivative represented by the following general formula (II):

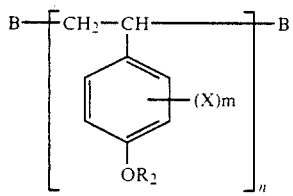

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

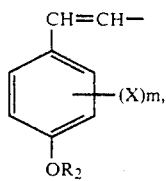

m is an integer of 1 to 4 and n is an integer of 5 to 100; a mixing ratio of the cyanate compound or isocyanate compound represented by the general formula (I) to the poly-(p-hydroxystyrene) derivative represented by the general formula (II) is in the range of 20:80 to 80:20 by weight.

2. A printed circuit board, which comprises a conductor of a metallic foil and an insulating layer made of a fibrous substrate material impregnated and cured with a thermosetting resin composition, the thermosetting resin composition comprising a cyanate compound or an isocyanate compound represented by the following general formula (I):

    (I)

wherein $R_1$ is an aromatic group an alicyclic group or a mixed group thereof and A is a cyanate group or an isocyanate group, and a poly-(p-hydroxystyrene) derivative represented by the following general formula (II):

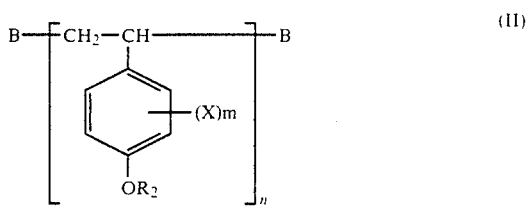

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

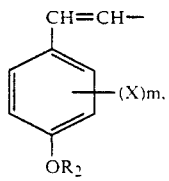

m is an integer of 1 to 4 and n is an integer of 5 to 100 and a compound having at least one N-substituted unsaturated imido group; a mixing ratio of the cyanate compound or isocyanate compound represented by the general formula (I) to the poly-(p-hydroxystyrene) derivative represented by the general formula (II) is in the range of 20:80 to 80:20 by weight.

3. A multi-layered, printed circuit board, which comprises a lamination of a plurality of printed circuit boards each comprising a conductor of a metallic foil and an insulating layer made of a fibrous substrate material impregnated and cured with a thermosetting resin composition, the thermosetting resin composition comprising a cyanate compound or an isocyanate compound represented by the following general formula (I)

    (I)

wherein $R_1$ is an aromatic group, an alicyclic group or a mixed group thereof and A is a cyanate group or an isocyanate group, and a poly-(p-hydroxystyrene) derivative represented by the following general formula (II):

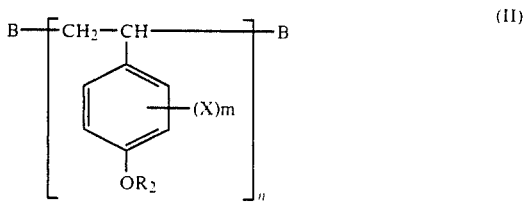

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

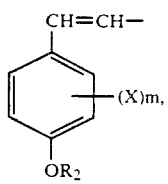

m is an integer of 1 to 4 and n is an integer of 5 to 100, or printed circuit boards each comprising a conductor of a metallic foil and an insulating layer made of a fibrous substrate material impregnated and cured with a thermosetting resin composition, the thermosetting resin composition comprising a cyanate compound or an isocyanate compound represented by the following general formula (I):

  (I)

wherein $R_1$ is an aromatic group, an alicyclic group or a mixed group thereof and A is a cyanate group or an isocyanate group, and a poly-(p-hydroxystyrene) derivative represented by the following general formula (II):

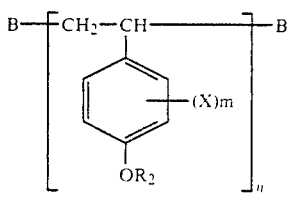  (II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

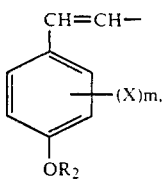

is an integer of 1 to 4 and n is an integer of 5 to 100 and a compound having at least one N-substituted unsaturated imido group; a mixing ratio of the cyanate compound or isocyanate compound represented by the general formula (I) to the poly-(p-hydroxystyrene) derivative represented by the general formula (II) is in the range of 20:80 to 80:20 by weight.

4. A curable material which comprises a woven fabric or non-woven fabric of inorganic fibers or organic fibers, impregnated with a thermosetting resin composition which comprises a cyanate compound or an isocyanate compound represented by the following general formula (I):

  (I)

wherein $R_1$ is an aromatic group, an alicyclic group or a mixed group thereof and A is a cyanate group or an isocyanate group, and a poly-(p-hydroxystyrene) derivative represented by the following general formula (II):

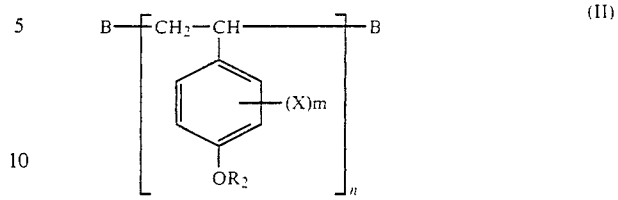

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

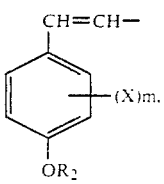

m is an integer of 1 to 4 and n is an integer of 5 to 100 or a thermosetting resin composition which comprises a cyanate compound or an isocyanate compound represented by the following general formula (I):

  (I)

wherein $R_1$ is an aromatic group, an alicyclic group or a mixed group thereof and A is a cyanate group or an isocyanate group, and a poly-(p-hydroxystyrene) derivative represented by the following general formula (II):

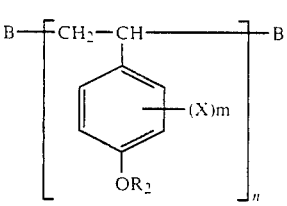  (II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

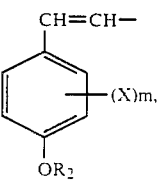

m is an integer of 1 to 4 and n is an integer of 5 to 100 and a compound having at least one N-substituted unsaturated imido group; a mixing ratio of the cyanate compound or isocyanate compound represented by the general formula (I) to the poly-(p-hydroxystyrene) derivative represented by the general formula (II) is in the range of 20:80 to 80:20 by weight.

5. A thermosetting resin composition which comprises a cyanate compound or an isocyanate compound represented by the following general formula (I):

  (I)

wherein $R_1$ is an aromatic group, an alicyclic group or a mixed group thereof and A is a cyanate group or an isocyanate group, and a poly-(p-hydroxystyrene) derivative represented by the following general formula (II):

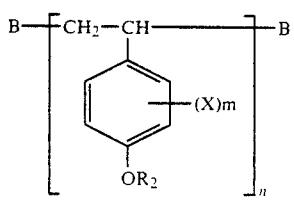 (II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

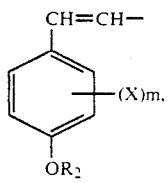

m is an integer of 1 to 4 and n is an integer of 5 to 100; a mixing ratio of the cyanate compound or isocyanate compound represented by the general formula (I) to the poly-(p-hydroxystyrene) derivative represented by the general formula (II) is in the range of 20:80 to 80:20 by weight.

6. A thermosetting resin composition which comprises a cyanate compound or an isocyanate compound represented by the following general formula (I):

  (I)

wherein $R_1$ is an aromatic group, an alicyclic group or a mixed group thereof and A is a cyanate group or an isocyanate group, and a poly-(p-hydroxystyrene) derivative represented by the following general formula (II):

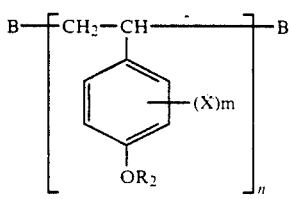 (II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

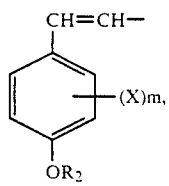

is an integer of 1 to 4 and n is an integer of 5 to 100 and a compound having at least one N-substituted unsaturated amido group; a mixing ratio of the cyanate compound or isocyanate compound represented by the general formula (I) to the poly-(p-hydroxystyrene) derivative represented by the general formula (II) is in the range of 20:80 to 80:20 by weight.

7. A process for producing a printed circuit board, which comprises:

a step of heating a thermosetting resin composition which comprises a cyanate compound or an isocyanate compound represented by the following general formula (I):

 (I)

wherein $R_1$ is an aromatic group, an alicyclic group or a mixed group thereof and A is a cyanate group or an isocyanate group, and a poly-(p-hydroxystyrene) derivative represented by the following general formula (II):

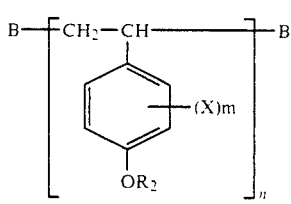 (II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

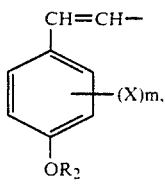

m is an integer of 1 to 4 and n is an integer of 5 to 100, thereby forming a prepolymer, a mixing ratio of the cyanate compound of isocyanate compound represented by the general formula (I) to the poly-(p-hydroxystyrene) derivative represented by the general formula (II) is in the range of 20:80 to 80:20 by weight;

a step of dissolving the prepolymer in a solvent, thereby forming an impregnation varnish, impregnating a fibrous substrate material with the impregnation varnish, followed by drying, thereby preparing a prepreg; and a step of laminating a plurality of the thus obtained prepregs, thereby obtaining a laminate, and pressing the laminate together with conductor metal foils with heating.

8. A process for producing a printed circuit board, which comprises:

a step of heating a thermosetting resin composition which comprises a cyanate compound or an isocyanate compound represented by the following general formula (I):

$$A-R_1-A \qquad (I)$$

wherein $R_1$ is an aromatic group, an alicyclic group or a mixed group thereof and A is a cyanate group or an isocyanate group, and a poly-(p-hydroxystyrene) derivative represented by the following general formula (II):

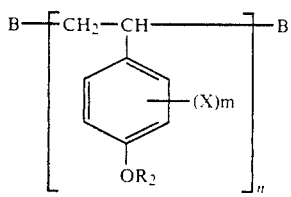

(II)

wherein X is a fluorine atom, a bromine atom or a chlorine atom, $R_2$ is an alkenyl group and an unsaturated carboxyl group, each having 2 to 4 carbon atoms, B is any one of a polymerization initiator residue, a polymerization-terminating agent residue, H and

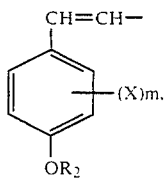

m is an integer of 1 to 4 and n is an integer of 5 to 100 and a compound having at least one N-substituted unsaturated imido group, thereby forming a prepolymer, a mixing ratio of the cyanate compound or isocyanate compound represented by the general formula (I) to the poly-(p-hydroxystyrene) derivative represented by the general formula (II) is in the range of 20:80 to 80:20 by weight;

a step of dissolving the prepolymer in a solvent, thereby forming an impregnation varnish, impregnating a fibrous substrate material with the impregnation varnish, followed by drying, thereby preparing a prepreg; and a step of laminating a plurality of the thus obtained prepregs, thereby obtaining a laminate, and pressing the laminate together with conductor metal foils with heating.

* * * * *